(12) United States Patent
Willson et al.

(10) Patent No.: US 9,120,947 B2
(45) Date of Patent: Sep. 1, 2015

(54) SURFACE TREATMENTS FOR ALIGNMENT OF BLOCK COPOLYMERS

(75) Inventors: C. Grant Willson, Austin, TX (US);
Christopher M. Bates, Austin, TX (US);
Jeffrey Strahan, Austin, TX (US);
Christopher John Ellison, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 149 days.

(21) Appl. No.: 13/583,518

(22) PCT Filed: Mar. 17, 2011

(86) PCT No.: PCT/US2011/028858
§ 371 (c)(1),
(2), (4) Date: Oct. 4, 2012

(87) PCT Pub. No.: WO2011/116217
PCT Pub. Date: Sep. 22, 2011

(65) Prior Publication Data
US 2013/0045361 A1 Feb. 21, 2013

Related U.S. Application Data

(60) Provisional application No. 61/315,278, filed on Mar. 18, 2010.

(51) Int. Cl.
*B05D 3/12* (2006.01)
*C09D 153/00* (2006.01)
*B81C 1/00* (2006.01)
*G03F 7/00* (2006.01)
*G03F 7/26* (2006.01)
*B05D 1/00* (2006.01)

(52) U.S. Cl.
CPC .......... *C09D 153/00* (2013.01); *B81C 1/00031* (2013.01); *G03F 7/0002* (2013.01); *G03F 7/265* (2013.01); *B05D 1/005* (2013.01); *B81C 2201/0149* (2013.01); *Y10T 428/24355* (2015.01); *Y10T 428/265* (2015.01)

(58) Field of Classification Search
CPC ................ B05D 1/005; B81C 1/0031; B81C 2201/0149; C09D 153/00
USPC ............................ 427/240, 425, 407.1, 385.5
See application file for complete search history.

(56) References Cited

U.S. PATENT DOCUMENTS

| 7,521,090 | B1 | 4/2009 | Cheng et al. | 427/256 |
| 2008/0176767 | A1 | 7/2008 | Millward | 428/105 |
| 2008/0217292 | A1 | 9/2008 | Millward et al. | 216/2 |

FOREIGN PATENT DOCUMENTS

WO WO/2011/116217 9/2011

OTHER PUBLICATIONS

Allen, R. D. et al. (1986) "Preparation of high purity, anionic polymerization grade alkyl methacrylate monomers" *Polymer Bulletin* 15(2), 127-134.
Bang, J. et al. (2007) "Facile Routes to Patterned Surface Neutralization Layers for Block Copolymer Lithography," *Advanced Materials* 19(24), 4552-4557.
Bates, F. S. et al. (1999) "Block Copolymers—Designer Soft Materials" *Physics Today* 52(2), 32-38.
Fetters, L. J. et al. (1994) "Connection between Polymer Molecular Weight, Density, Chain Dimensions, and Melt Viscoelastic Properties," *Macromolecules* 27(17), 4639-4647.
Ham, S. et al. (2008) "Microdomain Orientation of PS-b-PMMA by Controlled Interfacial Interactions," *Macromolecules* 41(17), 6431-6437.
Han, E. et al. (2007) "Photopatternable Imaging Layers for Controlling Block Copolymer Microdomain Orientation," *Advanced Materials* 19(24), 4448-4452.
Han, E. et al. (2009) "Perpendicular Orientation of Domains in Cylinder-Forming Block Copolymer Thick Films by Controlled Interfacial Interactions," *Macromolecules* 42(13), 4896-4901.
Jung, Y. S. et al. (2007) "Orientation-Controlled Self-Assembled Nanolithography Using a Polystyreneâ0̂ Polydimethylsiloxane Block Copolymer," *Nano Letters* 7(7), 2046-2050.
Kim, S. O. et al. (2006) "Defect Structure in Thin Films of a Lamellar Block Copolymer Self-Assembled on Neutral Homogeneous and Chemically Nanopatterned Surfaces," *Macromolecules* 39(16), 5466-5470.
Mansky, P. et al. (1997) "Controlling Polymer-Surface Interactions with Random Copolymer Brushes" *Science* 275(7), 1454-1457.
Niemz, A. et al. (2006) "Fabrication of Nanoporous Templates from Diblock Copolymer Thin Films on Alkylchlorosilane-Neutralized Surfaces," *Langmuir* 22(26), 11092-11096.
Peters, R. D. et al. (2000) "Using Self-Assembled Monolayers Exposed to X-rays to Control the Wetting Behavior of Thin Films of Diblock Copolymers," *Langmuir* 16(10), 4625-4631.
Ruiz, R. et al. (2008) "Density Multiplication and Improved Lithography by Directed Block Copolymer Assembly," *Science* 321(5891), 936-939.

(Continued)

*Primary Examiner* — Kirsten Jolley
(74) *Attorney, Agent, or Firm* — Medlen & Carroll, LLP

(57) ABSTRACT

The present invention relates to a method the synthesis and utilization of random, cross-linked, substituted polystyrene copolymers as polymeric cross-linked surface treatments (PXSTs) to control the orientation of physical features of a block copolymer deposited over the first copolymer. Such methods have many uses including multiple applications in the semiconductor industry including production of templates for nanoimprint lithography.

13 Claims, 6 Drawing Sheets

(56) References Cited

OTHER PUBLICATIONS

Ryu, D. Y. et al. (2009) "Cylindrical Microdomain Orientation of PS-b-PMMA on the Balanced Interfacial Interactions: Composition Effect of Block Copolymers," *Macromolecules* 42(13), 4902-4906.

Ryu, D. Y. et al. (2007) "Surface Modification with Cross-Linked Random Copolymers: Minimum Effective Thickness," *Macromolecules* 40(12), 4296-4300.

Stoykovich, M. P. et al. (2005) "Directed Assembly of Block Copolymer Blends into Nonregular Device-Oriented Structures," *Science* 5727(308), 1442-1446.

Uhrig, D. et al. (2005) "Experimental techniques in high-vacuum anionic polymerization," *Journal of Polymer Science Part A: Polymer Chemistry* 43(24), 6179-6222.

Van Oss, C. J. et al. (1988) "Additive and nonadditive surface tension components and the interpretation of contact angles," *Langmuir* 4(4), 884-891.

International Preliminary Report on Patentability, mailed Jun. 24, 2011.

SURFACE TREATMENTS FOR ALIGNMENT OF BLOCK COPOLYMERS

FIELD OF THE INVENTION

The present invention relates to a method for the synthesis and utilization of cross-linked substituted polystyrene copolymers as surface treatments (PXSTs) for control of the orientation of the physical features of a block copolymer deposited over the first copolymer. Such methods have many uses including multiple applications in the semiconductor industry including production of templates for nanoimprint lithography.

BACKGROUND OF THE INVENTION

Appropriately structured block copolymers (BCs) self-assemble into regular patterns with features that are less than 100 nm [1] and can be exploited in nanomanufacturing applications such as microelectronics, solar cells, and membranes. Hexagonally packed cylinders aligned perpendicular to the substrate surface are one of the more useful nanostructures for these applications. Multiple surface treatment techniques have been reported that enable this orientation including surface treatment with alkyl chlorosilanes [2, 3], chemical patterning [4-6], and polymer "brushes" [7-10]. However, control over feature size and orientation is still lacking. What is needed is a method which provides a large process latitude in the necessary control over feature orientation.

SUMMARY OF THE INVENTION

The present invention relates to a method for the synthesis and utilization of random cross-linked substituted polystyrene copolymers as surface treatments (PXSTs) for control of the orientation of the physical features of a block copolymer deposited over the first copolymer. Such methods have many uses including multiple applications in the semiconductor industry including production of templates for nanoimprint lithography. A wide range of surface energies can be obtained from these materials, and the results show the PXSTs need not be constituted from the identical two monomers in the block copolymer (BC) to obtain a wide process latitude for perpendicular orientation.

In one embodiment, the invention relates to a method, comprising: a) providing: i) a crosslinkable polymer comprising first and second monomers, ii) a block copolymer comprising third and fourth monomers, wherein said third and fourth monomers are chemically different from said first and second monomers; b) coating a surface with said crosslinkable polymer to create a first film; c) treating said first film under conditions such that crosslinkable polymer is crosslinked; d) coating said first film with said block copolymer to create a second film, and e) treating said second film under conditions such that nanostructures form, wherein the shape (and/or orientation) of the nanostructures is controlled (at least in part) by the chemical nature of said first film (and in some embodiments, it is also controlled in part by film thickness). In one embodiment, the block copolymer forms cylindrical nanostructures, said cylindrical nanostructures being substantially vertically aligned with respect to the plane of the first film. In one embodiment, said coating of step b) comprises spin coating. In one embodiment, the thickness of said first film is greater than 5.5 nm and less than 30 nm. In one embodiment, the thickness of said first film is between 10 and 30 nm. In one embodiment, said thickness of said first film is between 15 and 20 nm. In one embodiment, said crosslinkable polymer comprises an azido group on said first or second monomer (although other crosslinkable groups are used in other embodiments). In one embodiment, the PXST can contain one or several comonomers, the comonomers need not be those that are used to produce the block copolymer. In one embodiment, said treating of said first film in step c) comprises heating. Alternatively said treating comprises treating with light. Furthermore, in one embodiment said treating comprises light and heat. In one embodiment, said third monomer is styrene and said block copolymer comprises polystyrene. In one embodiment, said block copolymer is a polystyrene-block-poly(methyl methacrylate) copolymer. In one embodiment, said coating of said first film in step d) comprises spin coating. In one embodiment, wherein the thickness of said second film is between 10 and 100 nm. In one embodiment, said thickness of said second film is between 20 and 70 nm. In one embodiment, the treating of step e) comprises heating (e.g. under vacuum) so that the film is annealed. In one embodiment, the nanostructures are less than 100 nm in height.

In further embodiments, the invention relates to a composition, comprising a second polymer film coated on a first polymer film, said first polymer film comprising first and second monomers, said second polymer film comprising third and fourth monomers, wherein said third and fourth monomers are chemically different from said first and second monomers. In one embodiment, said second film comprises physical structures on a nanometer scale or "nanostructures", said physical structures controlled by the chemical nature of said first film. In one embodiment, said second film comprises cylindrical nanostructures, said cylindrical nanostructures being substantially vertically aligned with respect to the plane of the first film. In one embodiment, the nanostructures are less than 100 nm in height (and more typically between 20 nm and 70 nm in height).

In one embodiment, said second film comprises a polystyrene-block-poly(methyl methacrylate) copolymer. In one embodiment, said first polymer film is coated on a surface. In one embodiment, said first polymer film is crosslinked. In one embodiment of the composition, the thickness of said first film is between 10 and 30 nm. In other embodiments, said thickness of said first film is between 15 and 20 nm. In one embodiment, the thickness of said second film is between 10 and 100 nm. In other embodiments, said thickness of said second film is between 20 and 70 nm.

BRIEF DESCRIPTION OF THE DRAWINGS

For a more complete understanding of the features and advantages of the present invention, reference is now made to the detailed description of the invention along with the accompanying figures.

FIG. 5A shows an atomic force microscopy (AMF) phase image of PS-b-PMMA on PXST where R═Br with a 23 nm process window. FIG. 5B shows an atomic force microscopy (AMF) phase image of PS-b-PMMA on PXST where R═Br with a 30 nm process window. FIG. 5C shows an atomic force microscopy (AMF) phase image of PS-b-PMMA on PXST where R═Br with a 36 nm process window. FIG. 5D shows an atomic force microscopy (AMF) phase image of PS-b-PMMA on PXST where R═Br with a 41 nm process window.

DEFINITIONS

Figure 1:
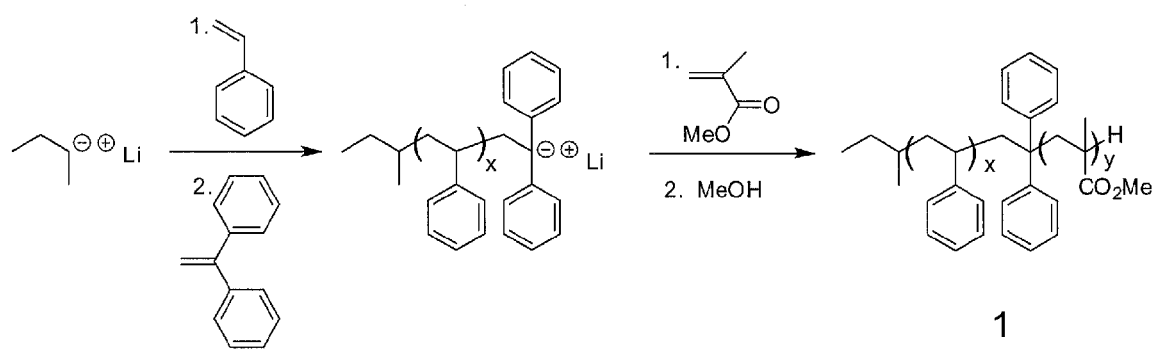
FIG. 1 shows the synthesis of poly(styrene-b-methyl methacrylate) (PS-b-PMMA). PS-b-PMMA was anionically synthesized via standard Schienk line techniques [11, 12].

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The present invention also contemplates styrene "derivatives" where the basic styrene structure is modified, e.g. by adding substituents to the ring (but preferably maintaining the vinyl group for polymerization). Derivatives can be, for example, hydroxy-derivatives, oxo-derivatives or halo-derivatives. As used herein, "hydrogen" means —H; "hydroxy" means —OH; "oxo" means ═O; "halo" means independently —F, —Cl, —Br or —I.

In addition, atoms making up the compounds of the present invention are intended to include all isotopic forms of such atoms. Isotopes, as used herein, include those atoms having the same atomic number but different mass numbers. By way of general example and without limitation, isotopes of hydrogen include tritium and deuterium, and isotopes of carbon include $^{13}C$ and $^{14}C$. Similarly, it is contemplated that one or more carbon atom(s) of a compound of the present invention may be replaced by a silicon atom(s). Furthermore, it is contemplated that one or more oxygen atom(s) of a compound of the present invention may be replaced by a sulfur or selenium atom(s).

Styrene is represented by the following structure:

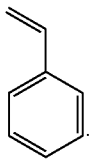

1-(chloromethyl)-4-vinylbenzene is represented by the following structure:

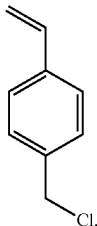

P-methylstyrene is an example of a styrene derivative and is represented by the following structure:

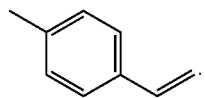

P-chlorostyrene is another example of a styrene halo-derivative and is represented by the following structure:

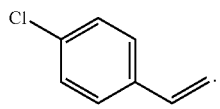

It is desired that the second film deposited over the first film develop "physical features on a nanometer scale," "nanofeatures" or "nanostructures" with controlled orientation. These physical features have shapes and thicknesses. For example, various structures can be formed by components of a block copolymer, such as vertical lamellae, in-plane cylinders, and vertical cylinders, and may depend on surface energies and film thickness. In a preferred embodiment, the second film develops cylindrical nanostructures, said cylindrical structures being substantially vertically aligned with respect to the plane of the first film. Orientation of structures in regions or domains at the nanometer level (i.e. "microdomains" or "nanodomains") may be controlled to be approximately uniform. The methods described herein can generate structures with the desired size, shape, orientation, and periodicity. Thereafter, in one embodiment, these nanostructures may be etched or otherwise further treated.

DETAILED DESCRIPTION OF THE INVENTION

Figure 3:
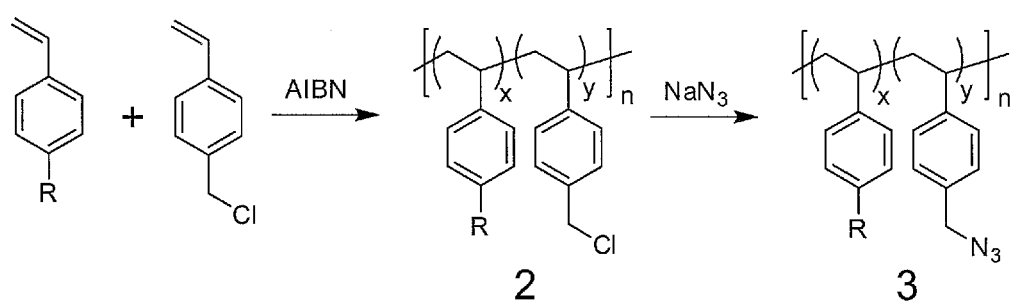
FIG. 3 shows the of a family of polymers with different surface energies made by polymerization of monomers having a variety of different substituents. The characterization of P(SR)-r-P(SBnAz) and the impact of the various substituents are shown in Table 1.
Figure 4:
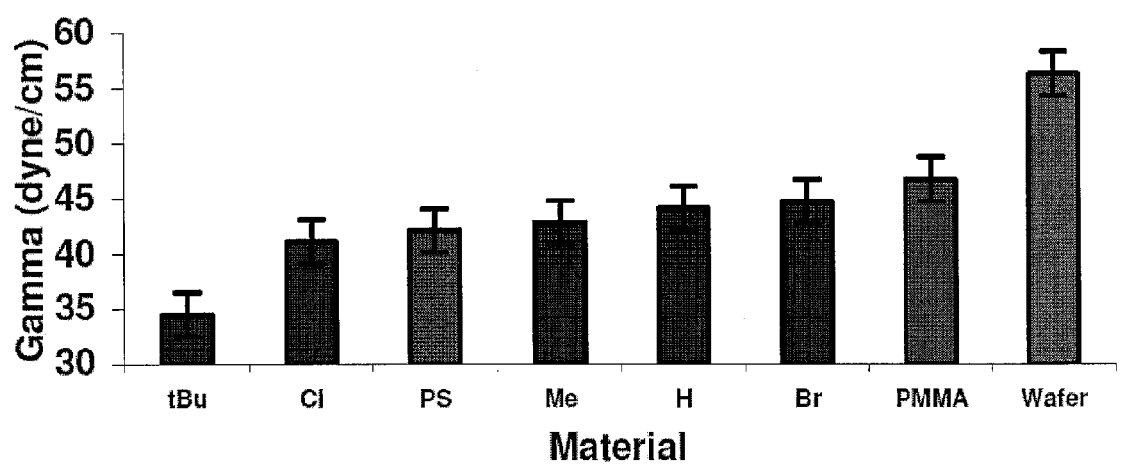
FIG. 4 shows the surface energies of PXSTs where R=tBu, Cl, Me, H, and Br (blue), homopolymers (red), and wafer (grey).
Figure 5:
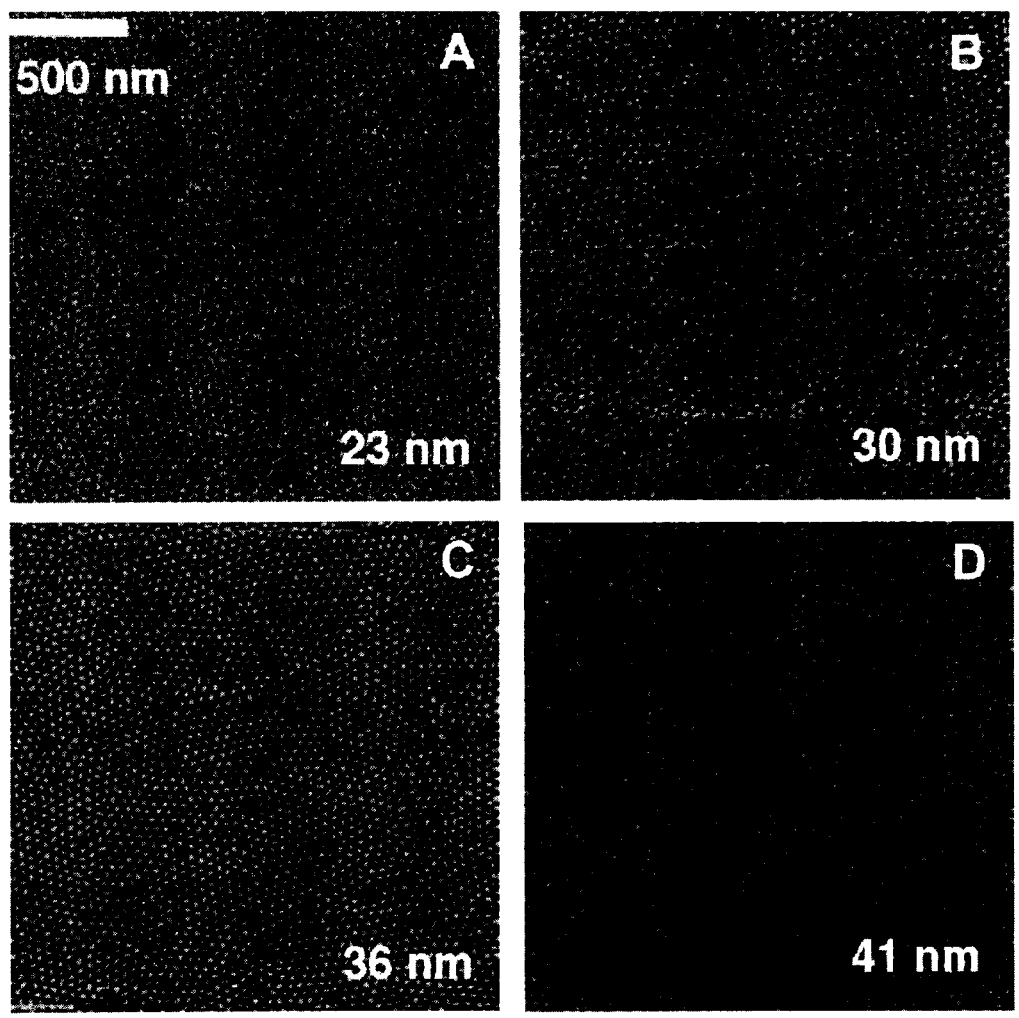
FIG. 5A-D show an atomic force microscopy (AMF) phase images of PS-b-PMMA on PXST where (R=Br).
Figure 6:
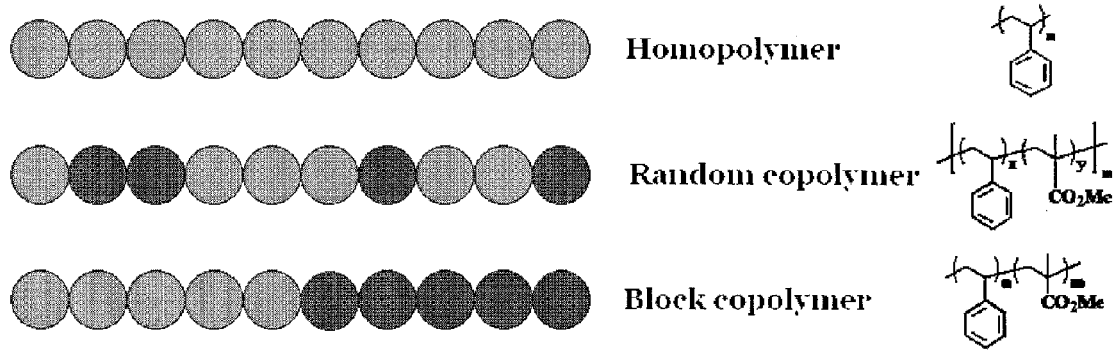
FIG. 6 is a schematic which shows the difference between homopolymers, random polymers and block polymers.

Surface Energies of PXSTs. In the course of our efforts to employ non-traditional monomers for BCs, we became interested in the effect of surface energy on BC orientation. Films thicker than 15 nm of polymer 3 (FIG. 3) were spin-coated, heated to cross-link through the azide functionality, and thoroughly rinsed to remove any non-cross-linked materials. Surface energies of these films were obtained by goniometry with water, glycerol, and diiodomethane contact angles. Several measurements were made over the entire wafer, and the error was consistently +/−2 dyne/cm. FIG. 4 displays these data and shows that the substituents affect the surface energy of the film. Additionally, the surface energies of non-cross-linked homopolymer films of PS and PMMA and a wafer cleaned with piranha were measured, and these values are consistent with the literature [2, 13].

In one embodiments, the invention relates to the PS-b-PMMA films of various thicknesses were coated on the PXSTs. These were annealed and investigated by AFM. The AFM images display very different process windows for perpendicular orientation of the PXSTs. The Cl-substituted PXST resulted in perpendicular cylinders for block film thicknesses of 30 to 35 nm, and the PXST with a Br substituent had a process window from 23 to 41 nm (FIG. 5A-D). These process window results are similar to other polymeric surface treatments reported by Nealey [14] and Hawker and Russell [10, 15, 16]. This leads to the conclusion that a PXST need not consist of the same monomers as the BC being coated.

DESCRIPTION OF ILLUSTRATIVE EMBODIMENTS

Figure 2:
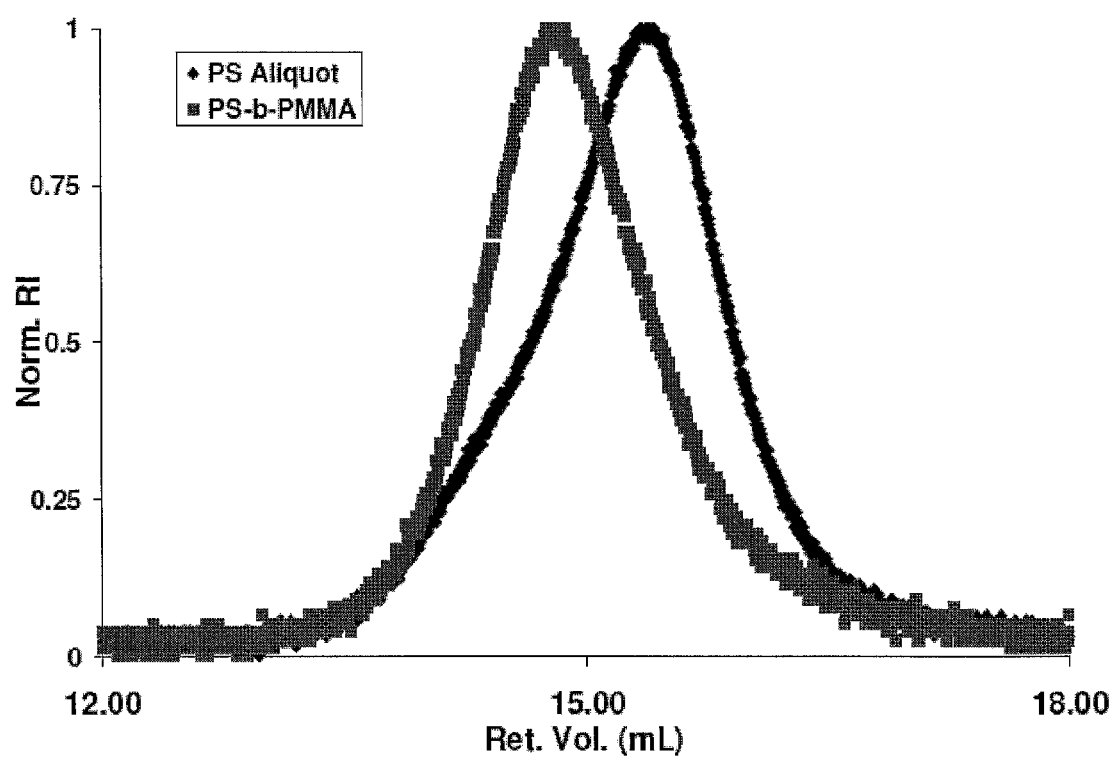
FIG. 2 shows the Refractive Index detector response from a Gel Permeation Chromatography (RI GPC) of PS-b-PMMA.

It is not intended that the present invention be limited to specific block polymers. However, to illustrate the invention, examples of various copolymers are provided. In one embodiment, the invention relates to the synthesis of the polystyrene-containing block copolymer "PS-b-PMMA." PS-b-PMMA was anionically synthesized via standard Schlenk line techniques (FIG. 1) [11, 12]. $^1$H-NMR showed the resulting polymer is 31 mol % PMMA, which corresponds to a volume fraction of 0.27 [17]. This is within the range for cylinder morphology [1]. The Mn of the PS aliquot was 45.8 kDa with a PDI of 1.18; the total molecular weight was 65.6 kDa with a PDI of 1.18. FIG. 2 shows GPC chromatograms of the PS aliquot and PS-b-PMMA.

In one embodiment, the invention relates to the synthesis of P(SR)-r-P(SBnAz). In a procedure similar to Hawker et al. [9], several commercially available styrene derivatives were radically copolymerized with vinyl benzyl chloride to investigate the role of substituents on the surface energy of PS. Upon isolation of 2, nucleophilic substitution of the chloride with azide ion led to cross-linkable polymers 3 (FIG. 3). The presence of the azide was confirmed by IR, and the resulting polymers are described in Table 1. Table 1 shows the characterization of P(SR)-r-P(SBnAz) (shown in FIG. 3) with different substituents at the R position.

General Materials and Methods

Materials.

All reagents were purchased from Sigma-Aldrich Chemical Co. and used without further purification unless otherwise noted. THF was purchased from JT Baker. 100 mm silicon wafers were purchased from Silicon Quest International.

Instrumentation.

All $^1$H and $^{13}$C NMR spectra were recorded on a Varian Unity Plus 400 MHz instrument. All chemical shifts are reported in ppm downfield from TMS using the residual protonated solvent as an internal standard (CDCl$_3$, $^1$H 7.26 ppm and $^{13}$C 77.0 ppm). Molecular weight and polydispersity data were measured using an Agilent 1100 Series Isopump and Autosampler and a Viscotek Model 302 TETRA Detector Platform with 3 I-series Mixed Bed High MW columns against polystyrene standards. Polymer solutions were filtered with 0.20 μm PTFE filters prior to spin coating. Films were spin coated and baked on a Brewer CEE 100CB Spincoater & Hotplate. Film thicknesses were determined with a J.A. Woollam Co, Inc. VB 400 VASE Ellipsometer using wavelengths from 382 to 984 nm with a 70° angle of incidence. Contact angles were measured with a Ramé-Hart, inc. NRL C.A. Goniometer (Model #100-00). A Heraeus Vacutherm Type VT 6060 P from Kendro was used to thermally anneal the films under reduced pressure. A Digital Instruments Dimension 3100 atomic force microscope with NCHR Pointprobe® Non-Contact Mode tips with a force constant of 42 N/m was used to collect AFM images.

EXAMPLE 1

Synthesis of poly(styrene-b-methyl methacrylate) (PS-b-PMMA (1))

PS-b-PMMA was synthesized as previously reported by sequential anionic polymerization of styrene and methyl methacrylate in THF at −78° C. under Ar atmosphere via standard Schlenk line techniques [11]. The initiator was sec-BuLi; diphenyl ethylene was used to properly initiate MMA, and LiCl was added to suppress side reactions during MMA propagation[12].

EXAMPLE 2

P(SR)-r-P(SBnAz) (3)

In a procedure adopted from Hawker et al. [9], a substituted styrene (20 mmol) and vinyl benzyl chloride (0.62 mmol) were radically copolymerized in refluxing THF (20 mL) for 48 h with enough AIBN to obtain a theoretical MW of 25 kDa. Once polymer 2 was precipitated in 0° C. MeOH, filtered, and dried in vacuo, the mol ratio of substituted styrene to vinyl benzyl chloride was determined by 1H-NMR. Taking into account this ratio and the Mn as determined by GPC, polymer 2 (1.0 g) and sodium azide (3 equiv/BnCl) were dissolved in DMF (20 mL) and stirred overnight at room temperature (rt). The polymer was precipitated in MeOH, filtered, redissolved in THF (10 mL), and stirred with H$_2$O (1 mL) to remove any unreacted salts. Finally, the polymer was isolated by precipitation in 0° C. MeOH, filtered, and dried in vacuo to yield white powder 3. Typical yields over these two steps were 50%; IR (KBr) 2100 cm-1. Complete characterization is shown in Table 1.

EXAMPLE 3

Surface Treatment with PXSTs

A film of P(SR)-r-P(SBnAz) was spin coated from a 1.0 wt % solution in toluene at 3770 rpm for 30 sec onto a wafer that had been rinsed with IPA and acetone. The wafer was immediately baked at 250° C. for 5 min to cross-link the film. The wafer was then submerged in toluene for 2 min, blown dry, submerged again for 2 min, and blown dry. Typical film thicknesses as determined by ellipsometry were 15-20 nm.

EXAMPLE 4

Surface Energy Measurements by Goniometry

Contact angles were measured with H$_2$O, diiodomethane, and glycerol, and analyzed via the Young-Dupre equation (Eq 1) and the Acid-Base Surface Energy Model (Eq 2) [18].

$$\gamma_{SV} = \gamma_{SL} + \gamma_{LV} \cos\theta - \pi_{eq} \qquad \text{Eq 1}$$

$\gamma_{SV}$ is the surface energy of the solid-vapor interface, $\gamma_{SL}$ is the interfacial energy of the solid-liquid interface, $\gamma_{LV}$ is the surface tension of the fluid, $\theta$ is the angle between the solid and liquid, and $\pi_{eq}$ is the equilibrium spreading pressure, which is approximately zero for polymeric surfaces.

$$\gamma_{12} = \gamma_{12}^{LW} + \gamma_{12}^{AB} \qquad \text{Eq 2}$$

$$-\gamma_2 \cos\theta = \gamma_2^{LW} - 2(\gamma_1^{LW}\gamma_2^{LW})^{1/2} + 2[(\gamma_2^{P+}\gamma_2^{P-})^{1/2} - (\gamma_1^{P+}\gamma_2^{P-})^{1/2} - (\gamma_1^{P-}\gamma_2^{P+})^{1/2}] \qquad \text{Eq 3}$$

Briefly, Eq 2 describes the interfacial energy between two components ($\gamma_{12}$) as the sum of the dispersion ($\gamma_{12}^{LW}$) and acid-base components ($\gamma_{12}^{AB}$). Eq 3 relates the surface energy of the film and cosine of the contact angle ($-\gamma_2 \cos\theta$) to the dispersion ($\gamma_2^{LW}$), Lewis acid ($\gamma_2^{P+}$), and Lewis base components ($\gamma_2^{P-}$). Using literature values for H$_2$O, diiodomethane, and glycerol, a system of equations was solved to obtain the surface energy of the PXST films.

Spin Coating and Annealing.

A clean, surface-treated wafer was spin coated with a film of PS-b-PMMA from toluene at various speeds and concentrations to give 20-70 nm films as determined by ellipsometry. Once cast, the wafer shards were annealed at 170° C. under reduced pressure for 12-18 h.

REFERENCES

1. Bates, F. S., and Fredrickson, G. H. (1999) Block Copolymers—Designer Soft Materials *Phys. Today* 52, 32-38.
2. Peters, R. D., Yang, X. M., Kim, T. K., Sohn, B. H., and Nealey, P. F. (2000) Using Self-Assembled Monolayers Exposed to X-Rays to Control the Wetting Behavior of Thin Films of Diblock Copolymers, *Langmuir* 16, 4625-4631.
3. Niemz, A., Bandyopadhyay, K., Tan, E., Cha, K., and Baker, S. M. (2006) Fabrication of Nanoporous Templates from Diblock Copolymer Thin Films on Alkylchlorosilane-Neutralized Surfaces, *Langmuir* 22, 11092-11096.
4. Ruiz, R., Kang, H., Detcheverry, F. A., Dobisz, E., Kercher, D. S., Albrecht, T. R., de Pablo, J. J., and Nealey, P. F. (2008) Density Multiplication and Improved Lithography by Directed Block Copolymer Assembly, *Science* 321, 936-939.
5. Stoykovich, M. P., Müller, M., Kim, S. O., Solak, H. H., Edwards, E. W., Pablo, J. J. d., and Nealey, P. F. (2005) Directed Assembly of Block Copolymer Blends into Non-regular Device-Oriented Structures, *Science* 5727, 1442-1446.
6. Kim, S. O., Kim, B. H., Kim, K., Koo, C. M., Stoykovich, M. P., Nealey, P. F., and Solak, H. H. (2006) Defect Structure in Thin Films of a Lamellar Block Copolymer Self-Assembled on Neutral Homogeneous and Chemically Nanopatterned Surfaces, *Macromolecules* 39, 5466-5470.
7. Mansky, P., Liu, Y., Huang, E., Russell, T. P., and Hawker, C. (1997) Controlling Polymer-Surface Interactions with Random Copolymer Brushes *Science* 275, 1454-1457.
8. Han, E., In, I., Park, S.-M., La, Y.-H., Wang, Y, Nealey, P. F., and Gopalan, P. (2007) Photopatternable Imaging Layers for Controlling Block Copolymer Microdomain Orientation, *Adv. Mater.* 19, 4448-4452.
9. Bang, J., Bae, J., Löwenhielm, P., Spiessberger, C., Given-Beck, S. A., Russell, T. P., and Hawker, C. J. (2007) Facile Routes to Patterned Surface Neutralization Layers for Block Copolymer Lithography, *Adv. Mater.* 19, 4552-4557.
10. Ham, S., Shin, C., Kim, E., Ryu, D. Y., Jeong, U., Russell, T. P., and Hawker, C. J. (2008) Microdomain Orientation of Ps-B-Pmma by Controlled Interfacial Interactions, *Macromolecules* 41, 6431-6437.
11. Uhrig, D., and Mays, J. W. (2005) Experimental Techniques in High-Vacuum Anionic Polymerization, *J. Polym. Sci. A.* 43, 6179-6222.
12. Allen, R. D., Long, T. E., and McGrath, J. E. (1986) Preparation of High Purity, Anionic Polymerization Grade Alkyl Methacrylate Monomers *Polym. Bull.* 15, 127-134.
13. Jung, Y. S., and Ross, C. A. (2007) Orientation-Controlled Self-Assembled Nanolithography Using a Polystyreneâ'' Polydimethylsiloxane Block Copolymer, *Nano Lett.* 7, 2046-2050.
14. Han, E., Stuen, K. O., Leolukman, M., Liu, C.-C., Nealey, P. F., and Gopalan, P. (2009) Perpendicular Orientation of Domains in Cylinder-Forming Block Copolymer Thick Films by Controlled Interfacial Interactions, *Macromolecules* 42, 4896-4901.
15. Ryu, D. Y, Wang, J.-Y., Lavery, K. A., Drockenmuller, E., Satija, S. K., Hawker, C. J., and Russell, T. P. (2007) Surface Modification with Cross-Linked Random Copolymers:Â€‰ Minimum Effective Thickness, *Macromolecules* 40, 4296-4300.
16. Ryu, D. Y., Ham, S., Kim, E., Jeong, U., Hawker, C. J., and Russell, T. P. (2009) Cylindrical Microdomain Orientation of Ps-B-Pmma on the Balanced Interfacial Interactions: Composition Effect of Block Copolymers, *Macromolecules* 42, 4902-4906.
17. Fetters, L. J., Lohse, D. J., Richter, D., Witten, T. A., and Zirkel, A. (1994) Connection between Polymer Molecular Weight, Density, Chain Dimensions, and Melt Viscoelastic Properties, *Macromolecules* 27, 4639-4647.
18. Van Oss, C. J., Good, R. J., and Chaudhury, M. K. (1988) Additive and Nonadditive Surface Tension Components and the Interpretation of Contact Angles, *Langmuir* 4, 884-891.

TABLE 1

| R | $M_w$ (kDa) | $M_n$ (kDa) | PDI | % BnAz ($^1$H-NMR) |
|---|---|---|---|---|
| H | 26.6 | 15.5 | 1.71 | 7.7 |
| Cl | 30.2 | 17.3 | 1.75 | 8.9 |
| Br | 38.1 | 19.5 | 1.95 | 5.0 |
| Me | 36.6 | 21.8 | 1.68 | 8.1 |
| tBu | 32.0 | 17.6 | 1.81 | 7.0 |

The invention claimed is:

1. A method, comprising:
   a. providing: i) a crosslinkable substituted copolymer comprising first and second monomers, wherein said crosslinkable substituted copolymer comprises a first monomer that is a halo-derivative and a second monomer comprising an azido group, ii) a block copolymer comprising third and fourth monomers, wherein said third and fourth monomers are chemically different from said first and second monomers;
   b. coating a surface with said crosslinkable polymer to create a first film;
   c. treating said first film under conditions such that crosslinkable polymer is crosslinked;
   d. coating said first film with said block copolymer to create a second film; and
   e. treating said second film under conditions such that nanostructures form, wherein the shape of the nanostructures is controlled by the chemical nature of said first film.

2. The method of claim 1, wherein the nanostructures comprise cylindrical structures, said cylindrical structures being substantially vertically aligned with respect to the plane of the first film.

3. The method of claim 1, wherein said coating of step b) comprises spin coating.

4. The method of claim 3, wherein the thickness of said first film is between 10 and 30 nm.

5. The method of claim 4, wherein said thickness of said first film is between 15 and 20 nm.

6. The method of claim 1, wherein said treating of said first film in step c) comprises heating.

7. The method of claim 1, wherein said third monomer is styrene and said block copolymer comprises polystyrene.

8. The method of claim 1, wherein said coating of said first film with said block copolymer to create a second film in step d) comprises spin coating.

9. The method of claim 8, wherein the thickness of said second film is between 10 and 100 nm.

10. The method of claim 9, wherein said thickness of said second film is between 20 and 70 nm.

11. The method of claim 1, wherein the treating of step e) comprises heating.

12. The method of claim 1, wherein said crosslinkable substituted copolymer comprises a crosslinkable substituted polystyrene copolymer comprises a first monomer that is a halo-derivative of styrene.

13. A method comprising,
   a. providing: i) a crosslinkable polymer comprising first and second monomers, wherein said crosslinkable polymer comprises an azido group on said first or second monomer, ii) a block copolymer comprising third and fourth monomers, wherein said third and fourth monomers are chemically different from said first and second monomers wherein said block copolymer is a polystyrene-block-poly(methyl methacrylate) copolymer;
b. coating a surface with said crosslinkable polymer to create a first film;
c. treating said first film under conditions such that crosslinkable polymer is crosslinked;
d. coating said first film with said block copolymer to create a second film; and
e. treating said second film under conditions such that nanostructures form, wherein the shape of the nanostructures is controlled by the chemical nature of said first film.

\* \* \* \* \*